(12) United States Patent
Trombley et al.

(10) Patent No.: US 8,010,930 B2
(45) Date of Patent: Aug. 30, 2011

(54) EXTRACTING CONSISTENT COMPACT MODEL PARAMETERS FOR RELATED DEVICES

(75) Inventors: Henry W. Trombley, Starksboro, VT (US); Josef S. Watts, South Burlington, VT (US)

(73) Assignee: International Business Machine Corporation, Armonk, NY (US)

( * ) Notice: Subject to any disclaimer, the term of this patent is extended or adjusted under 35 U.S.C. 154(b) by 403 days.

(21) Appl. No.: 12/344,724

(22) Filed: Dec. 29, 2008

(65) Prior Publication Data
US 2010/0169849 A1    Jul. 1, 2010

(51) Int. Cl.
*G06F 17/50* (2006.01)
(52) U.S. Cl. .......................... 716/132; 703/2
(58) Field of Classification Search .......... 716/132; 703/2
See application file for complete search history.

(56) References Cited

U.S. PATENT DOCUMENTS

| | | | |
|---|---|---|---|
| 4,759,675 A | 7/1988 | Bond et al. | |
| 5,379,232 A | 1/1995 | Komoda | |
| 5,396,615 A | 3/1995 | Tani | |
| 5,543,334 A | 8/1996 | Yoshii et al. | |
| 5,651,099 A * | 7/1997 | Konsella | 706/13 |
| 5,687,355 A * | 11/1997 | Joardar et al. | 703/2 |
| 5,867,398 A * | 2/1999 | Scepanovic et al. | 716/123 |
| 5,994,912 A | 11/1999 | Whetsel | |
| 6,314,390 B1 | 11/2001 | Bittner et al. | |
| 6,356,861 B1 * | 3/2002 | Singhal et al. | 703/2 |
| 6,430,729 B1 | 8/2002 | Dewey et al. | |
| 6,446,022 B1 | 9/2002 | Coss, Jr. et al. | |
| 6,577,993 B1 | 6/2003 | Sakamoto | |
| 6,594,594 B1 | 7/2003 | Tsai | |
| 6,934,671 B2 | 8/2005 | Bertsch et al. | |
| 7,089,512 B2 | 8/2006 | Iadanza et al. | |
| 7,099,808 B2 | 8/2006 | Suaya et al. | |
| 7,263,477 B2 | 8/2007 | Chen et al. | |
| 7,289,859 B2 | 10/2007 | Miwa et al. | |

(Continued)

FOREIGN PATENT DOCUMENTS

JP    2001148469 A    5/2001

(Continued)

OTHER PUBLICATIONS

Trombley et al., "Methods to Select Devices for Device Model Extractions", U.S. Appl. No. 12/031,374, filed Feb. 14, 2008.

*Primary Examiner* — Naum Levin
(74) *Attorney, Agent, or Firm* — Wood, Herron & Evans, LLP

(57) ABSTRACT

A method, apparatus and program product are provided for extracting parameters for compact models for semiconductor devices. A first set of parameters associated with first and second semiconductor devices is defined and has the same value for all devices. A second set of parameters associated with the semiconductor devices is defined having values that differ among the devices. Data is measured from the semiconductor devices related to the first and second set of parameters. A mathematical relationship is established between the measured data, and the values of the second set of parameters are adjusted to fit the established mathematical relationship. The mathematical relationship may also be a correlation of the measured data from the first semiconductor device with the measured data from the second semiconductor device creating a data set for parameter extraction. Parameters may then be extracted from the data set related to the first and second semiconductor devices.

13 Claims, 5 Drawing Sheets

U.S. PATENT DOCUMENTS

| | | |
|---|---|---|
| 7,305,332 B1 | 12/2007 | Lee et al. |
| 7,353,473 B2 | 4/2008 | Pino et al. |
| 7,624,079 B2 * | 11/2009 | Hartman et al. ........ 706/16 |
| 2003/0114944 A1 | 6/2003 | Bernstein et al. |
| 2003/0220779 A1 | 11/2003 | Chen et al. |
| 2005/0086033 A1 | 4/2005 | Chen et al. |
| 2006/0282802 A1 | 12/2006 | Yechuri |
| 2007/0261011 A1 | 11/2007 | Pino et al. |
| 2009/0187525 A1 * | 7/2009 | Agrawal et al. ........ 706/50 |
| 2010/0099033 A1 * | 4/2010 | Cohen ........ 430/5 |
| 2010/0217568 A1 * | 8/2010 | Takeuchi ........ 703/2 |

FOREIGN PATENT DOCUMENTS

| | | |
|---|---|---|
| WO | 2007016183 A2 | 2/2007 |

* cited by examiner

EXTRACTING CONSISTENT COMPACT MODEL PARAMETERS FOR RELATED DEVICES

BACKGROUND

The invention relates generally to semiconductor device fabrication and, in particular, to parameter extraction for device models.

Device models are commonly used to scientifically model the physical phenomena observed during the operation of semiconductor devices, such as complementary metal oxide semiconductor (CMOS) devices like field effect transistors. Physically-based device modeling for the operational description of semiconductor devices is essential during the design phase to ensure the reliability of integrated circuits containing the semiconductor devices. The device model is an input for a circuit simulator.

Semiconductor manufacturing technologies generally consist of a group of different transistor types to facilitate many types of circuit designs. Compact models are created for each of these transistor types. Because many of the processing steps are shared among different devices, different devices can often have similar characteristics. However, because compact model extraction is done on a device-by-device basis, these similarities can be lost in the model. This is generally more apparent where the device model has to be extrapolated into a space where no hardware data exists.

Some devices may be categorized into device families, sharing many device characteristic but different in certain other characteristics (e.g., high $V_T$, low $V_T$). These devices have characteristics that are similar in a lot of ways and should behave similarly as well. A single device model may have several hundred parameters to fit. Some parameters shared by these devices should have relationships and some should not. Contemporary modeling tools generally address one device at a time. When device modelers extract a device model for a device with a high $V_T$, for example, they may fit the device model to achieve better correlation to data physically obtained from the device. Other device modelers may encounter a device model for a similar device with a low $V_T$ and fit the parameters for this model differently, where if they were evaluated together, might result in a simple scaling of some parameters of the device model. Because different individuals may be extracting device models and because the extractions for the device models of families of devices may be done at different times, inconsistencies may be introduced into the models that are not discovered until quality checking is performed. Additionally, contemporary model extraction tools do not force any consistency between related devices. Consistency is generally checked at the end of the modeling process and if problems exist, they are typically corrected by adjusting parameters and reextraction, forcing repetition of steps in the process and adding time to the overall design.

What is needed therefore is a methodology to provide better consistency between models and model parameters.

BRIEF SUMMARY

Embodiments of the present invention address these and other challenges in the art by providing a method, apparatus and program product for extracting parameters for compact models for semiconductor devices. A first set of parameters associated with first and second semiconductor devices is defined and has the same value for all devices. A second set of parameters associated with the first and second semiconductor devices is defined having values that differ among the devices. Data is measured from the first and second semiconductor devices related to the first and second set of parameters. A mathematical relationship is established between the measured data, and the values of the second set of parameters are adjusted to fit the established mathematical relationship.

For some of the parameters in some embodiments, the mathematical relationship may include a ratio between the measured data of the first semiconductor device and the measured data of the second semiconductor device. Other relationships may include an offset between the measured data of the first semiconductor device and the measured data of the second semiconductor device, while still other mathematical relationships may enforce parameters in the first and second sets of parameters to have the same value. The mathematical relationships for some embodiments may be stored with model parameters.

In some embodiments, the values of the second sets of parameters may be adjusted by optimizing the values of the second set of parameters with the measured data and may include a complex fitness function, which contain penalty functions. Alternatively, in some embodiments, the values of the second set of parameters may be adjusted by calculating correlation coefficients between the measured data and selected parameters of the second set of parameters to measure consistency between the compact models, which may then be used to determine of parameters need be re-extracted.

In other embodiments of the invention, the physical data from a first semiconductor device and physical data from a second semiconductor device may be measured. The measured physical data from the first semiconductor device may then be correlated with the measured physical data from the second semiconductor device in order to create a data set for parameter extraction. Parameters are extracted from the data set relating to the first and second semiconductor devices. The correlation may include correlating key parameters of the measured data to a specific device parameter, such as threshold voltage ($V_T$) for example. The correlation may also fit measured physical data from the first semiconductor device and the second semiconductor device to a curve, in other embodiments.

BRIEF DESCRIPTION OF THE SEVERAL VIEWS OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
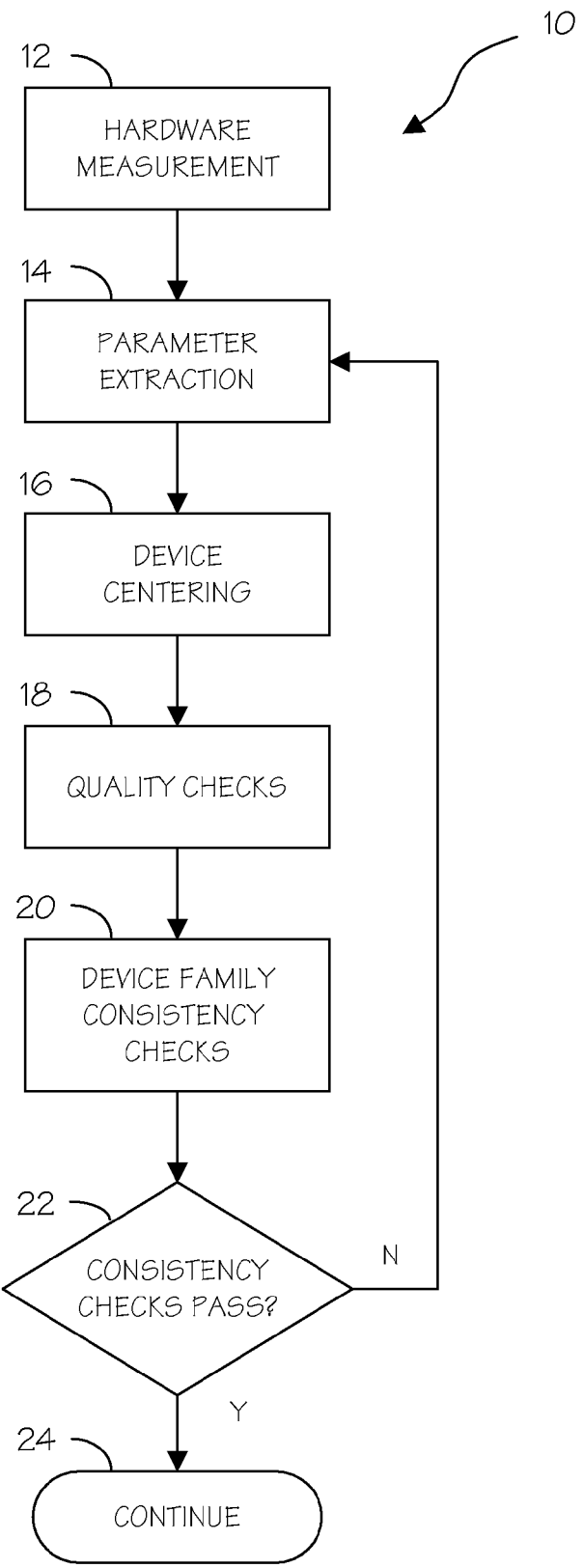
FIG. 1 is a flowchart illustrating an exemplary prior art design methodology with device consistency checks.

Contemporary design tools for semiconductor devices generally do not account for consistency in device models for families of device because the contemporary tools analyze only one device at a time. This necessitates additional checks, which tend to happen late in the design process. For example and with reference to the flowchart 10 in FIG. 1, a set of devices is to be analyzed. These devices may be part of a family of devices or the devices may share at least one process step but fewer than all process steps in the fabrication of the devices. A contemporary analysis process, as shown in FIG. 1, begins by performing hardware measurements (block 12) for each of the devices. For example, if this set of devices contains device 1, device 2, and device 3, hardware measurements may be performed on each device. This may be done serially or in parallel, and the devices may be contained on a single test chip or be located on other test chips on other parts of a test wafer, for example. Associated with the hardware measurements for each of the devices is a set of parameters, which when extracted from the measured data can be used with the device models in simulations.

Transistor models are used for almost all modern electronic design work. Analog circuit simulators use models to predict the behavior of a design. Much of the design work is related to integrated circuit designs which have a very large tooling cost, primarily for the photomasks used to create the devices, and there is a large economic incentive to get the design working without any iterations. Complete and accurate models allow a large percentage of designs to work the first time. Modern circuits are usually very complex making the performance of such circuits difficult to predict without accurate computer models, including but not limited to models of the devices used. The device models generally include effects of transistor layout: width, length, interdigitation, proximity to other devices; transient and DC current-voltage characteristics; parasitic device capacitance, resistance, and inductance; time delays; and temperature effects; to name a few items.

Traditional model-extraction methods are generally based on a combination of direct parameter extraction that uses mathematical simplification of the model equations, and optimization that uses the full, highly non-linear model equations. Because of the complexity of the model and data, these methods allow optimization of only a few parameters at at time. Optimization also often leads to local optimas which do not result in a model that is accurate enough to be useful, or may lead to inconsistencies between models of related devices.

For example, each device (1, 2, and 3) may have a parameter set $\{x_1, x_2, x_3, \ldots, x_i, x_j, x_k, \ldots, x_{N-1}, x_N\}$. These devices may belong to a family of devices and as being part of a family one skilled in the art would expect that many of these parameters may have the same value across each of the devices; however, a subset of the parameters that control the device models may have different values but still cause the model to have similar behavior in each of the devices. This subset may be $\{x_i, x_j, x_k\}$ from the example parameter set above.

Each of the parameters for each of the devices is extracted from the hardware measurements (block 14) and the model parameters then go through a device centering step (block 16). Generally during the device centering steps, a limited set of model parameters is adjusted to make key model characteristics match set technology targets. This step is typically performed to account for variations in processing, which make it challenging to identify a set of "perfect" nominal devices to use for model extraction. This becomes even more challenging when a new technology is in development and is not yet achieving target values. After the centering steps, quality checks are performed on the extracted device model (block 18) for each of the devices. Once the set of devices have passed the quality check, a family consistency check is performed (block 20). At this stage the model is used for simulations of key device characteristics across the entire allowable range of device size, temperature, and bias conditions and checked for consistency between all devices in a family of devices. If the consistency checks fail, ("No" branch of decision block 22), then the portions of the models that are failing need to be modified and re-extracted (block 14) from the measured data which may need to be adjusted, or further manipulated or optimized prior to extraction. Then the device centering (block 16) and quality checks (block 18) are repeated. This continues until the family consistency checks pass ("Yes" branch of decision block 22) allowing the process to continue (block 24) to the next stages of the simulation process, adding time to the overall design process.

Figure 2:
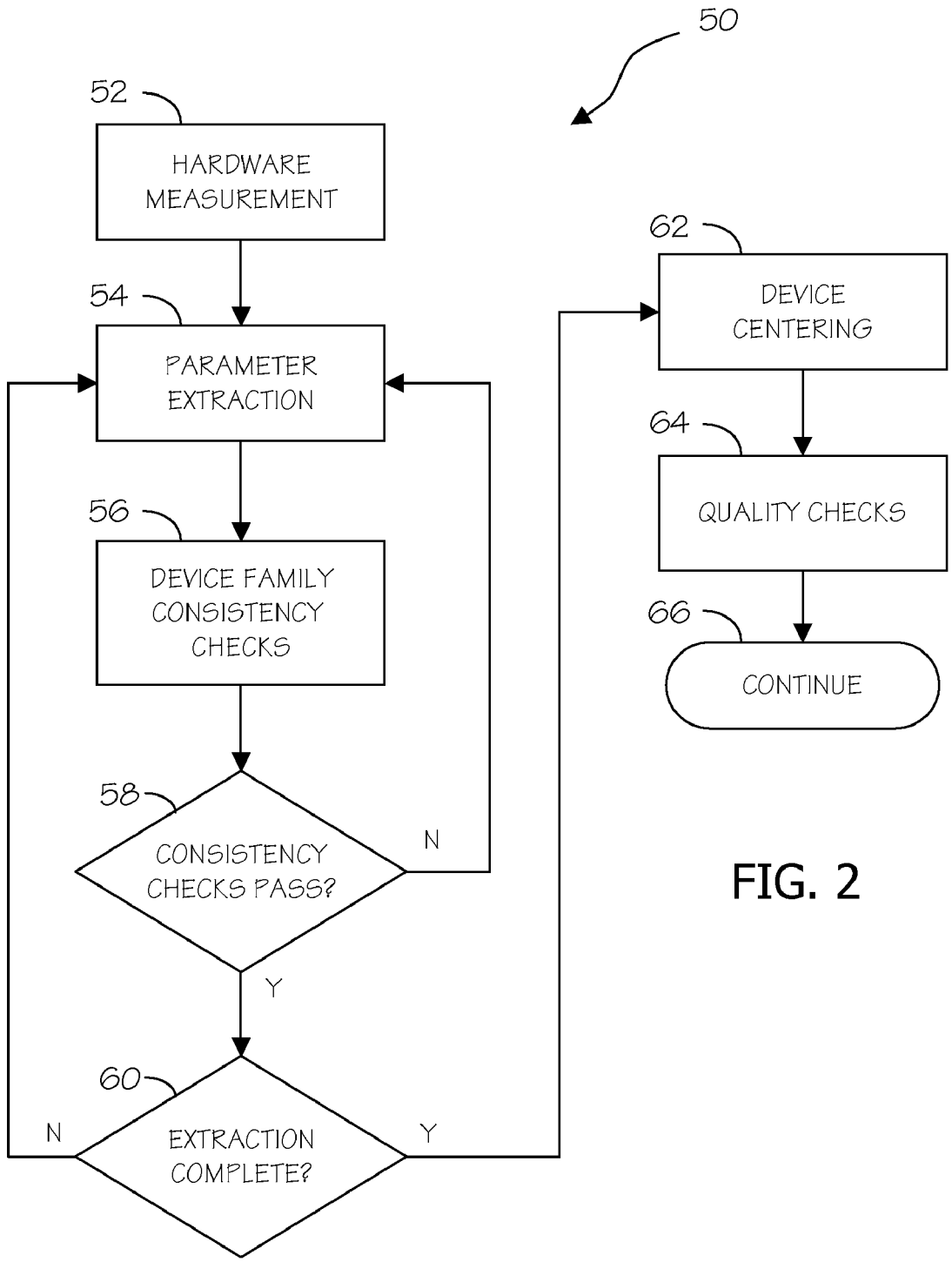
FIG. 2 is a flowchart illustrating a design methodology for an embodiment of the invention.

An alternative to the contemporary process of FIG. 1 is shown in an embodiment of the process in the flowchart 50 in FIG. 2. In this embodiment, the device family consistency checks may be moved up in the design process. Similar to the contemporary method of FIG. 1, hardware measurements are performed on multiple devices (block 52). Parameters may then be extracted from the measured data (block 54). When parameter extraction for a device is completed up to a consistency checkpoint, it is compared against the other devices in the grouping or family that have been completed to the same point (block 56). The comparison may include checking for relationships of specific parameters in the models for each device and relationships between predicted $V_T$, currents, and derivatives at specific geometries and biases for the different models. If the consistency checks do not pass ("No" branch of decision block 58), then the inconsistent parameters may be re-extracted (block 54) as disclosed above, but prior to continuing with the process. If the consistency check passes ("Yes" branch of decision block 58), then a check is made to see if the parameter extraction is complete (block 60). If the parameter extraction is not complete ("No" branch of decision block 60), then the parameter extraction (block 54) and consistency checks (blocks 56, 58) are repeated. Once all of the parameters have been extracted ("Yes" branch of decision block 60), the device centering (block 62) and quality checks (block 64) are performed, similar to the contemporary process. The process may then continue (block 66) to the next stages of the simulation process. By moving the consistency checks up in the process, this embodiment assists in streamlining the design process by avoiding repetition of some of the later process steps such as centering and quality checks.

Figure 3:
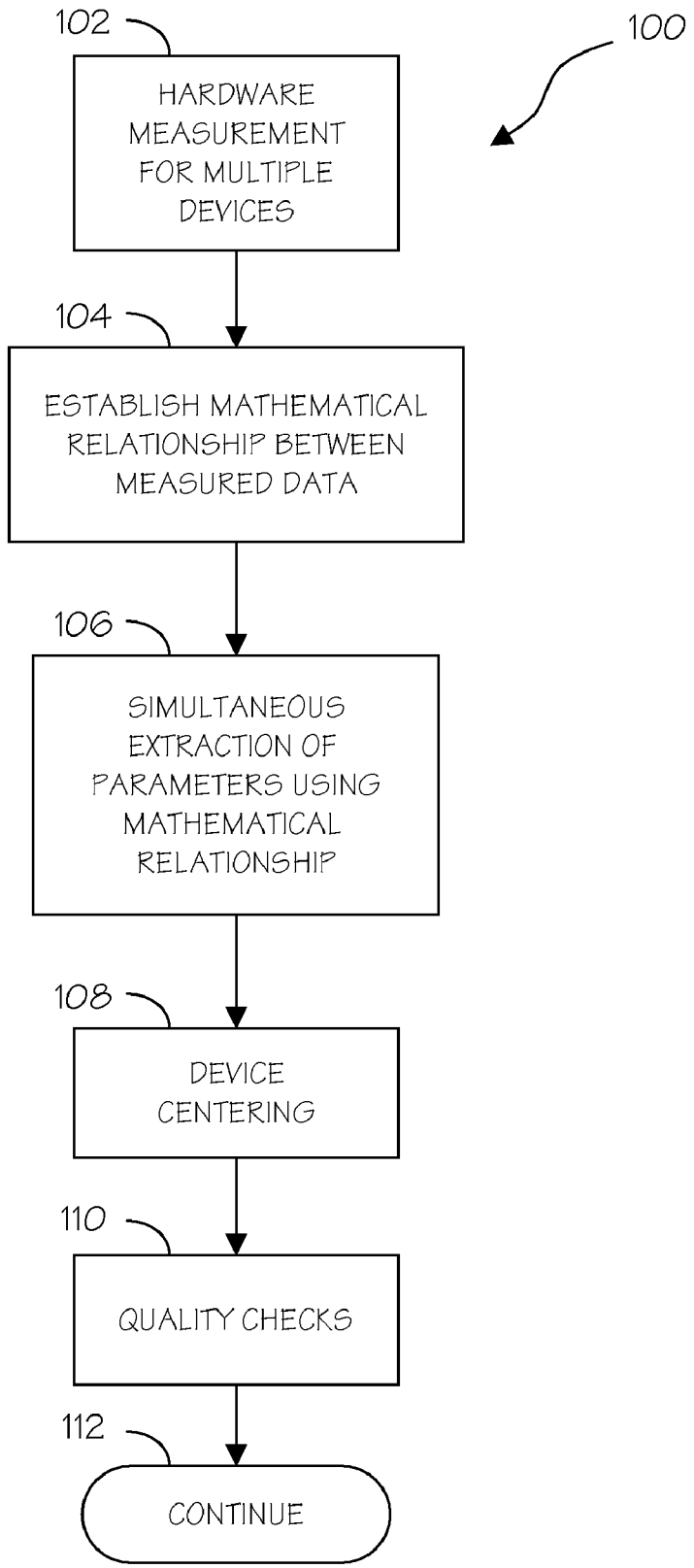
FIG. 3 is a flowchart illustrating a design methodology for an alternative embodiment of the invention.

In an alternative embodiment shown in the flowchart 100 in FIG. 3, parameter extraction may be accomplished with fixed relationships, minimizing the need to perform device family consistency checks. In this embodiment, consistencies between models and model parameters may be built into the parameter extraction rather than checking for consistency later as with the contemporary method of FIG. 1 or the embodiment in FIG. 2. In this embodiment, hardware measurements are performed on multiple devices (block 102). With knowledge of the devices and the data measured from each of the devices, mathematical relationships may be determined between the measured data (block 104) and the device models. For example, first order analysis of the hardware data against physically based device equations may be used to determine starting values for key model parameters. These parameters may be fixed at these values or allowed to change only a limited amount from their respective values. Examples may include $V_{THO}$ being set to the relation determined by long device $V_{tlin}$ or LPE0 being set by measured $V_T$ roll-up.

Additionally, model parameters may also be optimized with a complex fitness functions to establish relationships between the parameters for a family of devices. These fitness functions may include penalty functions for parameters that did not maintain a mathematically defined relationship to the same parameter for other devices. Penalty functions may also include $V_T$, current, or derivatives calculated at specific bias and geometry points that may have deviated from a target value derived from hardware for multiple devices. These penalty functions may be used to maintain similarity between devices. Additionally, the penalty functions may be used for deviation from specified geometric trends such as $V_T$ roll-off with width or ratio of off currents between devices of different lengths.

In some embodiments, the establishment of the mathematical relationships (block 104) may be an interactive process with the device designer. Data for the same device geometries and biases may be shown for all devices in a group with measured and simulated data overlaid. Trend plots with length, width, and temperature may also be available. The trend plots may allow measured and simulated data to be displayed simultaneously for all devices in a group for analysis. The device modeler may then select parameters for optimization, which may then be optimized for all device types simultaneously. Other mathematical relations may be enforced as part of the optimization such as an offset or ratio between parameters. This offset or ratio may be optimized within user-controlled limits or could be fixed. Alternatively, the offset or ratio may be set to a fixed value determined from parameters outside of the optimization. An offset of zero may indicate that some of the selected parameters may have the same value in all models.

After the mathematical relationships between the parameters have been established, parameters may be simultaneously extracted (block 106) using the relationships. For example, during parameter extraction, limits may be set based on the value of a parameter in a model or models in other related devices. A parameter could be limited to the value of the same parameter for another device within a tolerance, or it could be limited to be between the values in two other devices. Once the extraction is completed, the device centering (block 108) and quality checks (block 110) steps may be performed similar to the embodiments above. After the quality checks, the process may continue (block 112) to the next stages of the simulation process. This embodiment minimizes the need for device family consistency checks as part of the process because the consistency between parameters for the family of devices is built in to the extraction process by way of the mathematical relationships established as part of the process.

Figure 4:
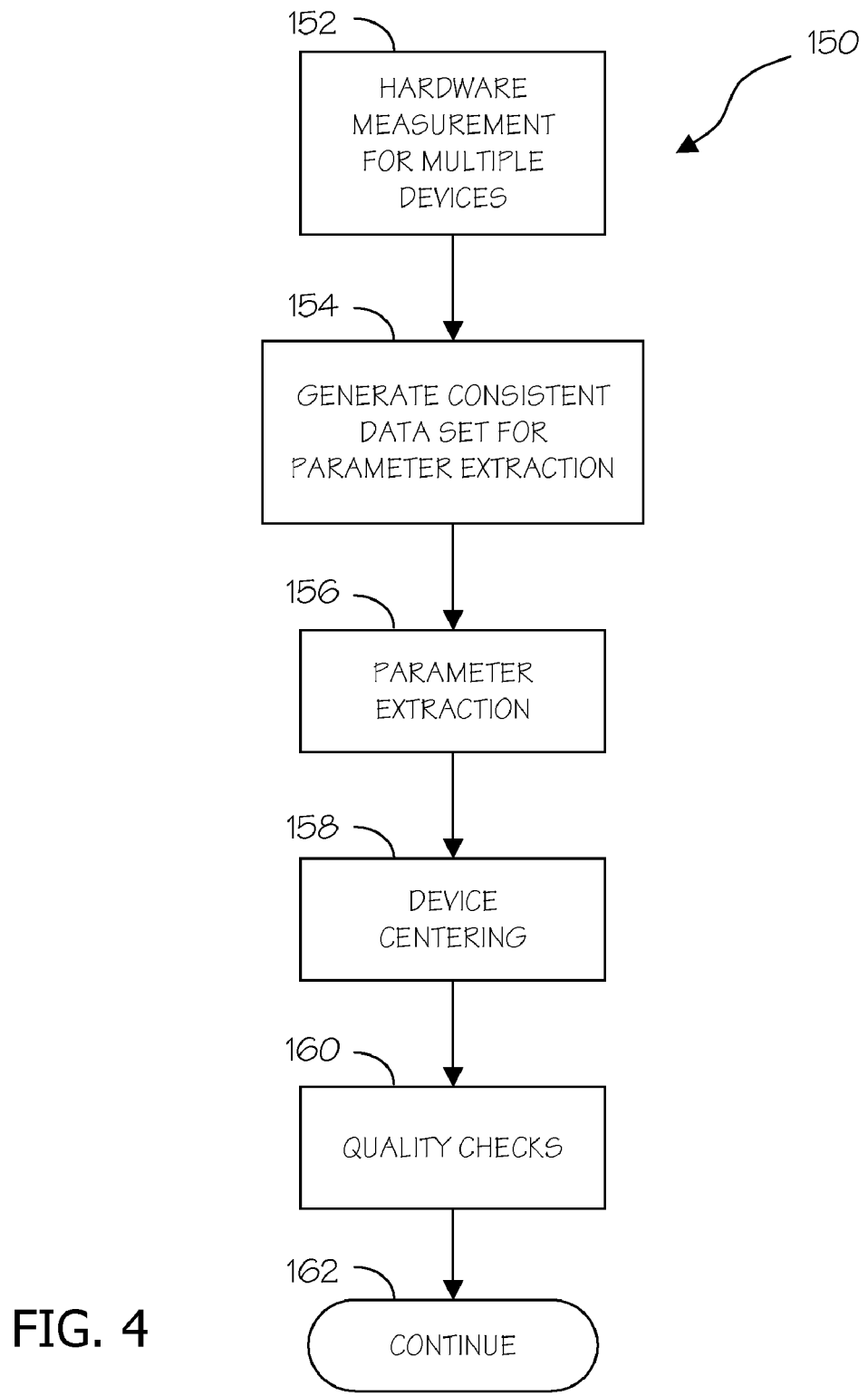
FIG. 4 is a flowchart illustrating a design methodology for another alternative embodiment of the invention.

In yet another alternative, similar to the embodiment above and seen in the flowchart 150 in FIG. 4, a consistent data set may be established before parameter extraction to provide for consistency between parameters of device families. In this embodiment, again hardware measurements are performed for multiple devices (block 152). From the hardware measurements, a consistent data set is generated for all devices that has the expected device characteristics and relational consistency (block 154). The calculation of correlation coefficients between the measured values and corresponding simulated values may be used as a measure of consistency between models. This may then be used as part of a complex fitness function, during optimization for example, for simultaneous extraction or for checking during parallel extraction. Correlation coefficients between these measured values and selected model parameters of each FET type may be a measure of model consistency. Although this measure is less direct than the correlation of measured and simulated data, it may assist in ensuring consistency for geometries not measured. This correlation coefficient may then be used as part of a complex fitness function during optimization for simultaneous extraction or for checking during parallel extraction.

Once a consistent data set is established from the measured data, parameters may be extracted (block 156) with a confidence level that the data used for the extraction has consistent behavior. After the parameters have been extracted, as with the previous embodiments, device centering (block 158) and quality checks (block 160) may be performed. The process may then continue (block 162) to the next stages of the simulation process.

Each of these methods in the embodiments above may be available to a designer with the designer being able to interact with some or all of steps including analyzing and creating the mathematical relationships, generating the consistent data set, correlating data, verifying consistency in device families, and adjusting models in the device centering steps. As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 5:
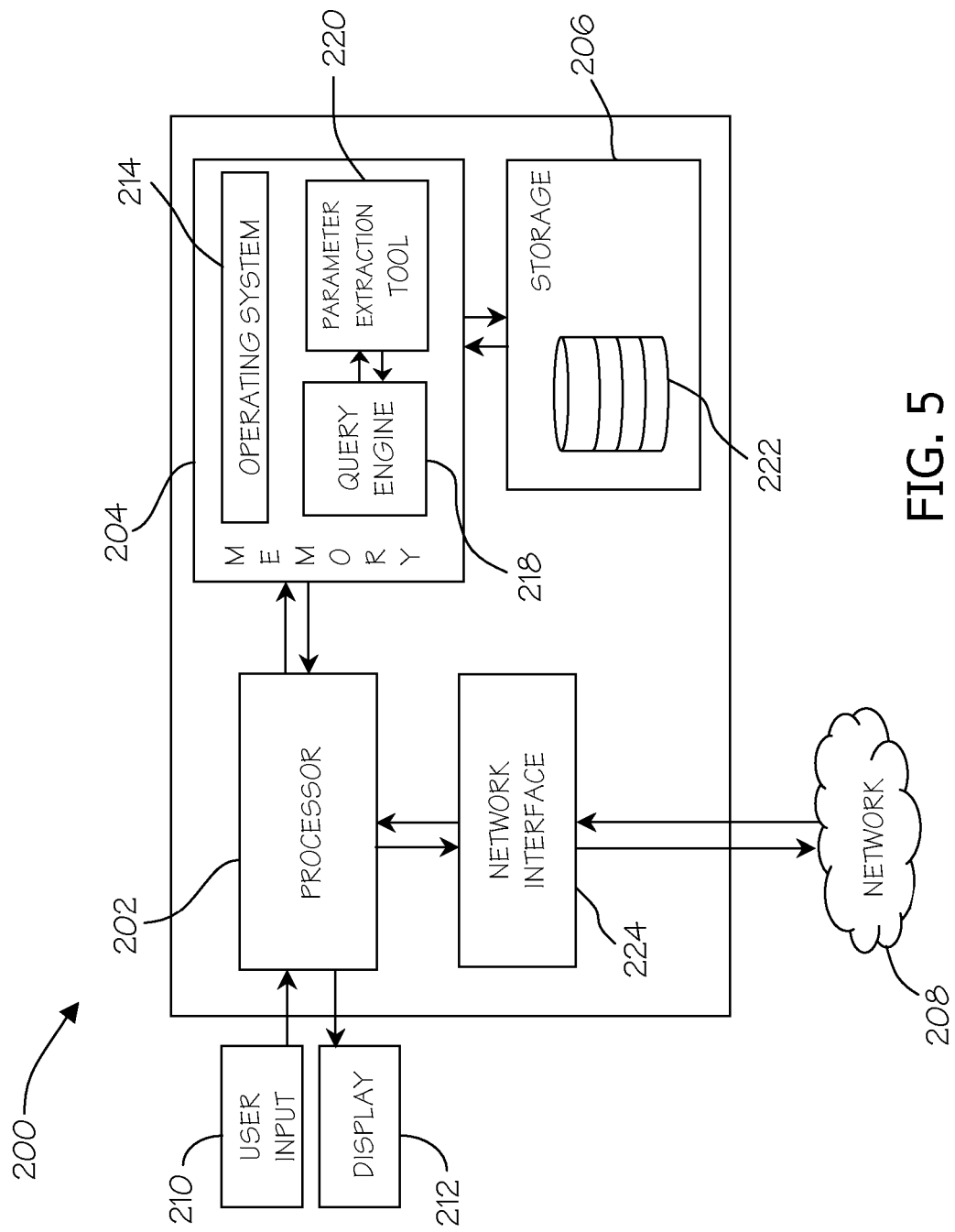
FIG. 5 is a block diagram of an exemplary hardware and software environment suitable for implementing the design methodologies of FIGS. 1-4.

FIG. 5 illustrates an exemplary hardware and software environment for an apparatus 200 suitable for extracting parameters for compact models for semiconductor devices consistent with embodiments of the invention. For the purposes of the invention, apparatus 200 may represent practically any computer, computer system, or programmable device e.g., multi-user or single-user computers, desktop computers, portable computers and devices, handheld devices, network devices, mobile phones, etc. Apparatus 200 will hereinafter be referred to as a "computer" although it should be appreciated that the term "apparatus" may also include other suitable programmable electronic devices.

Computer 200 typically includes at least one processor 202 coupled to a memory 204. Processor 202 may represent one or more processors (e.g. microprocessors), and memory 204 may represent the random access memory (RAM) devices comprising the main storage of computer 200, as well as any supplemental levels of memory, e.g., cache memories, non-volatile or backup memories (e.g. programmable or flash memories), read-only memories, etc. In addition, memory 204 may be considered to include memory storage physically located elsewhere in computer 200, e.g., any cache memory in a processor 202, as well as any storage capacity used as a virtual memory, e.g., as stored on a mass storage device 206 or another computer coupled to computer 200 via a network 208.

Computer 200 also typically receives a number of inputs and outputs for communicating information externally. For interface with a user or operator, computer 200 typically includes one or more user input devices 210 (e.g., a keyboard, a mouse, a trackball, a joystick, a touchpad, a keypad, a stylus, and/or a microphone, among others). Computer 200 may also include a display 212 (e.g., a CRT monitor, an LCD display panel, and/or a speaker, among others). The interface to computer 200 may also be through an external terminal connected directly or remotely to computer 200, or through another computer communicating with computer 200 via a network 208, modem, or other type of communications device.

Computer 200 operates under the control of an operating system 214, and executes or otherwise relies upon various computer software applications, components, programs, objects, modules, data structures, etc. (e.g. simulator 218 or parameter extraction tool 220). Simulator 218, for example, may require device parameters extracted by the parameter extraction tool 220 from the compact device models and physical data. Computer 200 communicates on the network 208 through a network interface 224.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments of the invention assist in building consistency into the device models during the extraction process. This may be accomplished by forcing key model parameters to the same value for device models or by forcing key model parameters to a specified relationship for the device models. Enforced checking of key model parameters relationships during the extraction process and limiting allowed model parameter ranges during extraction to values determined by a theoretical analysis of the data and known relationships between the devices assists in improving parameter consistency and also assists in creating a set of self consistent targets for devices that are used during the extraction of some model components. Simultaneous extraction of devices may also be employed to force the model consistency during the extraction process, potentially avoiding later problems with consistency. Generally it is more efficient to build consistency into the models during the extraction process than to try to correct issues with consistency at the end of the process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for extracting parameters for compact models for semiconductor devices, the method comprising:
   using a computer for:
   defining a first set of parameters associated with first and second semiconductor devices that have the same value for all devices;
   defining a second set of parameters associated with the first and second semiconductor devices, wherein the values of the second set of parameters differ among the devices;
   measuring data from the first and second semiconductor devices related to the first and second set of parameters;
   establishing a mathematical relationship between the measured data; and
   adjusting values of the second set of parameters to fit the established mathematical relationship.

2. The method of claim 1 wherein the mathematical relationship includes a ratio between the measured data of the first semiconductor device and the measured data of the second semiconductor device.

3. The method of claim 1 wherein the mathematical relationship includes an offset between the measured data of the first semiconductor device and the measured data of the second semiconductor device.

4. The method of claim 1 wherein the mathematical relationship enforces parameters in the first and second sets of parameters to have the same value.

5. The method of claim 1 wherein the mathematical relationship is stored with the first and second set of parameters.

6. The method of claim 1 wherein adjusting the values of the second set of parameters includes an optimization of the values of the second set of parameters with the measured data.

7. The method of claim 6 wherein the optimization is performed with a complex fitness function including penalty functions.

8. The method of claim 1 wherein adjusting values of the second set of parameters includes calculating correlation coefficients between the measured data and values of selected parameters of the second set of parameters to measure consistency between the compact models.

9. The method of claim 1 wherein the first and second semiconductor devices share at least one process step, but fewer than all process steps.

10. An apparatus comprising:
    a processor; and
    program code configured to be executed by the processor to extract parameters for compact models for semiconductor devices, the program code configured to define a first set of parameters associated with first and second semiconductor devices that have the same value for all devices, define a second set of parameters associated with the first and second semiconductor devices, wherein the values of the second set of parameters differ among the devices, measuring data from the first and second semiconductor devices related to the first and second set of parameters, establish a mathematical relationship between the measured data, and adjust values of the second set of parameters to fit the established mathematical relationship.

11. The apparatus of claim 10 wherein the mathematical relationship is selected from a group consisting of a ratio between the measured data of the first semiconductor device and the measured data of the second semiconductor device, an offset between the measured data of the first semiconductor device and the measured data of the second semiconductor device, an equality between a portion of the measured data of the first semiconductor device and a portion of the measured data of the second semiconductor device, and combinations thereof.

12. The apparatus of claim 10 wherein the program code is configured to adjust the values of the second set of parameters by optimizing the values of the second set of parameters with the measured data.

13. The apparatus of claim 10 wherein program code is configured to adjust the values of the second set of parameters by calculating correlation coefficients between the measured data and values of selected parameters of the second set of parameters to measure consistency between the compact models.

* * * * *